(12) United States Patent
Nakao

(10) Patent No.: US 10,712,414 B2
(45) Date of Patent: Jul. 14, 2020

(54) APPARATUS AND METHOD FOR ANALYZING SPECTRUM

(71) Applicant: JEOL Ltd., Tokyo (JP)

(72) Inventor: Tomoki Nakao, Tokyo (JP)

(73) Assignee: JEOL Ltd., Tokyo (JP)

( * ) Notice: Subject to any disclaimer, the term of this patent is extended or adjusted under 35 U.S.C. 154(b) by 9 days.

(21) Appl. No.: 16/190,533

(22) Filed: Nov. 14, 2018

(65) Prior Publication Data

US 2019/0154778 A1 May 23, 2019

(30) Foreign Application Priority Data

Nov. 16, 2017 (JP) ................... 2017-220787

(51) Int. Cl.
*G01R 33/46* (2006.01)
(52) U.S. Cl.
CPC ............... *G01R 33/4625* (2013.01)
(58) Field of Classification Search
CPC .............................. G01R 33/4625
USPC ................................ 324/307, 309
See application file for complete search history.

(56) References Cited

U.S. PATENT DOCUMENTS 8,400,148 B2 * 3/2013 Hirata ................. G01R 33/485
324/307

OTHER PUBLICATIONS

More, "The Levenberg-Marquardt Algorithm: Implementation and Theory", prepared for Conference on Numerical Analysis University of Dundee, Scotland, operated under contract W-31-109-Eng-38 for the U.S. Energy Research and Development Administration, Jun. 28-Jul. 1, 1977.
Laatikainen et al., "A Computational Strategy for the Deconvolution of NMR Spectra with Multiplet Structures and Constraints: Analysis of Overlapping 13C—2H multiplets of 13C Enriched Metabolites from Cell Suspensions Incubated in Deuterated Media", Magnetic Resonance in Medicine, Apr. 12, 1996, No. 36, pp. 359-365.
Soininen et al., "Strategies for organic impurity quantification by 1HNMR spectroscopy: Constrained total-line-shape fitting", Analytica Chimica Acta, Apr. 22, 2005, pp. 178-185, vol. 542.
Sigl, "Nonlinear Residual Minimization by Iteratively Reweighted Least Squares", Computational Optimization and Applications Journal, Apr. 28, 2015, pp. 1-37.
Daubechies et al., "Iteratively Reweighted Least Squares Minimization for Sparse Recovery", Communications on Pure and Applied Mathematics, 2010, pp. 1-38, vol. LXIII.

* cited by examiner

*Primary Examiner* — Farhana A Hoque
(74) *Attorney, Agent, or Firm* — The Webb Law Firm

(57) ABSTRACT

A baseline component in an NMR spectrum (observed spectrum) is expressed as a sparse signal in a time space. In a nonlinear fitting under a condition of minimizing an Lp norm (wherein p≤1), the Lp norm functions to emphasize the sparsity of a norm computation target. Using these two properties, an optimum solution of a coefficient vector to be given to a computed vector is searched to minimize the Lp norm for a residual vector in the time space corresponding to a residual spectrum.

9 Claims, 8 Drawing Sheets

FIG.4

```
Initialization
  τ(> 0), λ(> 0), k_max(> 0)                                    ⎫
  ε(> 0)                                                         ⎬ ···(S10)
  k = 0                                                          ⎪
  α_0, J_0 = J(α_0)                                             ⎭
while k <= k_max do
    w_j = [|(A[y - y_m(α_k)])(j)| + ε]^((p-2)/2)                 ···(S12)
    W = diag({w_1, ..., w_Nj})                                   ···(S14)
    H = ∇y_m(α_k)^T A^H W^T W A ∇y_m(α_k)                        ···(S16)
    H̃ = H + λdiag(H)                                             ···(S18)
    h = ∇y_m(α_k)^T A^H W^T W A[y - y_m(α_k)]                    ···(S20)
    α_{k+1} = α_k + H̃^+ h                                        ···(S22)
    J_{k+1} = J(α_{k+1})                                         ···(S24)
    if J_{k+1} < J_k then                                        ···(S26)
        λ = λ/τ                                                  ···(S28)
    else
        λ = τλ                                                   ···(S30)
        α_{k+1} = α_k                                            ···(S32)
        J_{k+1} = J_k                                            ···(S34)
    end if                                                       ···(S36)
    k = k + 1                                                    ···(S38)
end while
```

APPARATUS AND METHOD FOR ANALYZING SPECTRUM

CROSS-REFERENCE TO RELATED APPLICATION

This application claims priority to Japanese Patent Application No. 2017-220787 filed Nov. 16, 2017, the disclosure of which is hereby incorporated in its entirety by reference.

BACKGROUND OF THE INVENTION

Field of the Invention

The present disclosure relates to an apparatus and a method for analyzing spectrum, and in particular, to a spectrum fitting technique.

Description of Related Art

As a spectrum to be a target of a spectrum analysis, there are known an NMR (Nuclear Magnetic Resonance) spectrum, an X-ray spectrum, a spectroscopic spectrum, a mass spectrum, and the like. In the spectrum analysis, for example, a search is conducted for an optimum set of coefficients to be given to a function that defines a computed spectrum (or simulated spectrum) which allows the closest fitting of the computed spectrum to an observed spectrum. Various methods of finding the optimum set of coefficients have been proposed.

For example, for the spectrum fitting, the LM (Levenberg-Marquardt) method is used. The LM method is one type of nonlinear least squares fitting, and a coefficient set a (more specifically, a coefficient vector a) which minimizes the following evaluation value J is determined (refer to Jorge J. More, The Levenberg-Marquardt Algorithm: implementation and theory, Conference of numerical analysis (1977)).

$$J = \frac{1}{2}\|y - y_m(a)\|_2^2 \quad (1)$$

In the above description, y represents the observed spectrum (vector), a represents the coefficient vector in the form of the coefficient set as described above, and y(a) is a computed spectrum (vector) generated by substituting the coefficient set a into a model function. The term $(y - y_m(a))$ in Equation (1) is a residual spectrum (vector). The coefficient of ½ on the right hand side of Equation (1) may alternatively be omitted, and the substance of the evaluation value J is an L2 norm.

In general, with regard to an Lp norm, two expressions shown below in Equations (2) and (3) are permitted. In the present disclosure, "Lp norm" basically refers to a norm expressed by Equation (3). For example, the above-described L2 norm is obtained by substituting 2 into p in Equation (3). An index n in Equations (2) and (3) shows a vector element number.

$$\|x\|_p = (|x_1|^p + |x_2|^p + \ldots + |x_n|^p)^{1/p} \quad (2)$$

$$\|x\|_p^p = |x_1|^p + |x_2|^p + \ldots + |x_n|^p \quad (3)$$

In relation to the spectrum fitting, a TLS (Total Line Shape fitting) method is also used. The TLS method is a method generally used in analysis of the NMR spectrum, and is also one type of nonlinear least squares fitting (refer to R. Laatikainen, M. Niemitz, W. J. Malaisse, M. Biesemans and R. Willem, A Computational Strategy for the Deconvolution of NMR spectra with Multiplet Structures and Constraints: Analysis of Overlapping 13C-2H multiplets of 13C Enriched metabolites from Cell Suspensions Incubated in Deuterated Media, Magn. Reson. Med., 36, 359 (1996); P. Soininen, J. Haarala, J. Vepsalainen, M. Niemitz and R. Laatikainen, Strategies for organic impurity quantification by 1H NMR spectroscopy: Constrained total-line-shape fitting, Analytica Chimica Acta., 29, 542 (2005); and Juliane Sigl, Nonlinear Residual Minimization by Iteratively Reweighted Least Squares, Comput. Optim. Appl. 64, 755 (2015)). In this method, a function which defines the computed spectrum includes a baseline function.

Non Patent Literature 1
Jorge J. More, The Levenberg-Marquardt Algorithm: implementation and theory, Conference of numerical analysis (1977).

Non Patent Literature 2
R. Laatikainen, M. Niemitz, W. J. Malaisse, M. Biesemans and R. Willem, A Computational Strategy for the Deconvolution of NMR spectra with Multiplet Structures and Constraints: Analysis of Overlapping 13C-2H multiplets of 13C Enriched metabolites from Cell Suspensions Incubated in Deuterated Media, Magn. Reson. Med., 36, 359 (1996).

Non Patent Literature 3
P. Soininen, J. Haarala, J. Vepsalainen, M. Niemitz and R. Laatikainen, Strategies for organic impurity quantification by 1H NMR spectroscopy: Constrained total-line-shape fitting, Analytica Chimica Acta., 29, 542 (2005).

Non Patent Literature 4
Juliane Sigl, Nonlinear Residual Minimization by Iteratively Reweighted Least Squares, Comput. Optim. Appl. 64, 755 (2015).

The observed spectrum generally includes a waveform-of-interest component and a baseline component. The waveform-of-interest component is, for example, a portion including one or a plurality of peaks, and is the primary analysis target. On the other hand, the baseline component is a component which is not the primary analysis target, and is a component which exists over a wide band in a frequency space. For example, in the NMR spectrum, a linking noise caused in a measurement stage, data loss after a digital filter process, a signal component derived from a molecular structure, or the like causes the baseline component. A change, a curvature, a slope, or the like having a large period forming a base in the NMR spectrum is the baseline component, or such a base itself is the baseline component.

When the LM method described above is applied to the spectrum including the baseline component as described above, fitting precision is degraded, because the baseline component is set as a target of fitting, along with the waveform-of-interest component. In the TLS method, a certain weight of coefficient must be given also to the baseline function. Because of this, problems may be caused in that a workload of a person conducting analysis is increased, an analysis time is increased, and a probability that an optimum solution cannot be determined is increased.

SUMMARY OF THE INVENTION

An advantage of the present disclosure lies in precise fitting of the computed spectrum with respect to the waveform-of-interest component. Alternatively, an advantage of the present disclosure is in realization of spectrum fitting which is not easily affected by the baseline component.

According to one aspect of the present disclosure, there is provided an apparatus for analyzing a spectrum, comprising: a processor that receives an observed spectrum and that analyzes the observed spectrum, wherein the processor searches an optimum set of coefficients by changing a set of coefficients to be assigned to a function which defines a computed spectrum such that an evaluation value for a residual vector in a predetermined space corresponding to a residual spectrum between the observed spectrum and the computed spectrum is minimized, the computed spectrum is fitted to a waveform-of-interest component in the observed spectrum, the predetermined space is a space in which a baseline component in the observed spectrum is expressed as a sparse signal, and the evaluation value is an Lp norm of the residual vector in the predetermined space (wherein $p \leq 1$).

In the above-described structure, the predetermined space is a space in which the baseline component in the observed spectrum is expressed as a sparse signal (that is, a signal including many zeros). That is, on a predetermined space axis, the baseline component does not exist over a wide band, but exists locally. On the other hand, it is known that, in the search of an optimum solution under a condition of minimizing the Lp norm (wherein $p \leq 1$), the Lp norm functions to promote or emphasize the sparsity of a target of norm computation. When such an Lp norm is used as the evaluation value of the residual vector, the search for the optimum solution progresses in a direction to increase the sparsity of the residual vector. For example, in place of the entirety of the residual vector being uniformly suppressed, the residual vector is suppressed in such a manner that many zeros or values near zero are caused in the residual vector. As a result, fitting with respect to the waveform-of-interest component is prioritized over the fitting with respect to the baseline component. In general, such a tendency is observed when p is less than or equal to 1, and the tendency becomes stronger as p is decreased. Therefore, according to the above-described search means, the precision of fitting of the computed spectrum with respect to the waveform-of-interest component can be increased without assigning to the baseline component a function dedicated to the baseline component.

According to another aspect of the present disclosure, the predetermined space is a time space. For example, the baseline component which is a wide-band signal on a frequency axis is expressed, on the time axis, as a signal having a pulse-shaped portion with a narrow width and a flat portion made of zeros or values almost equal to zero. That is, the baseline component is expressed as a sparse signal on the time axis. The above-described structure utilizes this property.

According to another aspect of the present disclosure, the residual vector in the predetermined space is determined by applying a transform matrix on the residual spectrum. The transform matrix is, for example, a matrix that transforms from the frequency space to the time space. Examples includes an IFFT (Inverse Fourier Transform) matrix.

According to another aspect of the present disclosure, the transform matrix includes a first transform matrix which transforms from a frequency space to the predetermined space, and a second transform matrix which applies a slope correction to the residual spectrum in the frequency space, and the second transform matrix and the first transform matrix are applied in this order to the residual spectrum before the slope correction. When the baseline component has a slope as a whole while having a change with a large period in the observed spectrum, the influence of the slope appears in the residual vector, and the search of the optimum solution may not go well. In consideration of this, the second transform matrix is applied to the residual spectrum to remove or reduce the slope component, and the first transform matrix is applied to the result of application of the second transform matrix.

According to another aspect of the present disclosure, an inputter for changing the value of p is provided. As described above, in general, as p is reduced, the tendency of a higher priority on the fitting with respect to the waveform-of-interest component than the fitting with respect to the baseline component becomes stronger. It is desirable to have a structure where p is variable according to a form of the baseline component, a necessary fitting precision, a computation time, or the like.

According to another aspect of the present disclosure, there is provided a method for analyzing a spectrum, comprising: receiving an NMR spectrum obtained by an NMR measurement; and searching an optimum set of coefficients by changing a set of coefficients to be assigned to a function which defines a computed spectrum such that an evaluation value for a residual vector in a predetermined space corresponding to a residual spectrum between the NMR spectrum and the computed spectrum is minimized, wherein the computed spectrum is fitted to a waveform-of-interest component in the NMR spectrum, the predetermined space is a space in which a baseline component in the NMR spectrum is expressed as a sparse signal, and the evaluation value is an Lp norm of the residual vector in the predetermined space (wherein $p \leq 1$).

The step of receiving the NMR spectrum and the step of searching the optimum set of coefficients are desirably executed by an information processor device.

In the above-described method, it is noticed that the baseline component which is not the target of spectrum analysis has the sparsity in the predetermined space and that the Lp norm (wherein $p \leq 1$) functions to increase the sparsity of the norm computation target during minimization of the Lp norm. Based on this knowledge, the Lp norm of the residual vector in the predetermined space is used as the evaluation value in the search of the optimum set of coefficients.

The above-described method is not characterized in the mathematical law itself, but is characterized in a specific process or computation to naturally remove portions that are not necessary for the fitting in the spectrum fitting process. A program which executes the spectrum analysis method may be installed in an information processor device (including a spectrum measurement apparatus) via a network or via a transportable recording medium.

BRIEF DESCRIPTION OF THE DRAWINGS

FIG. 4 is a conceptual diagram showing an algorithm according to the first configuration.

DESCRIPTION OF THE INVENTION

An embodiment of the present disclosure will now be described with reference to the drawings.

Figure 1:
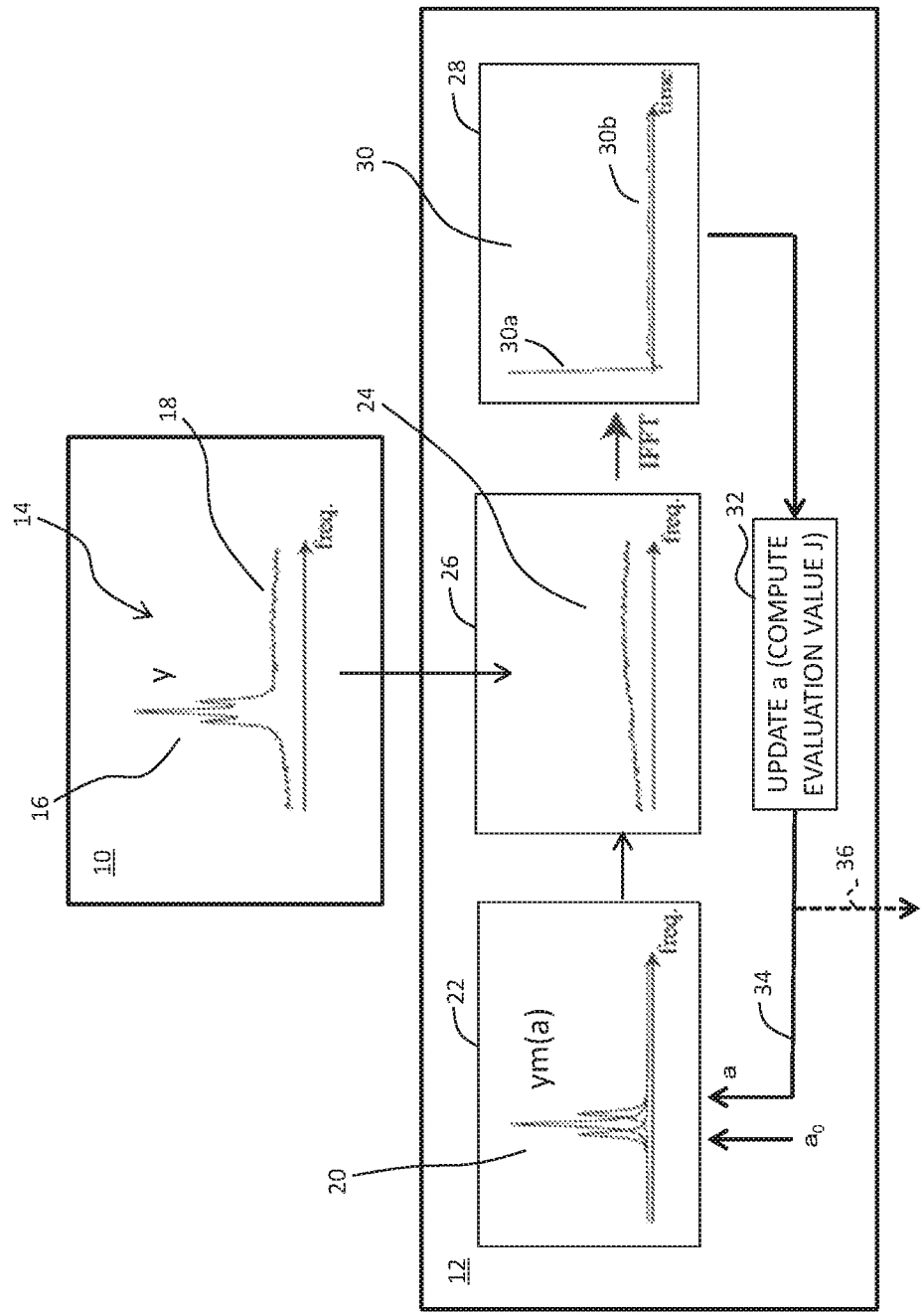
FIG. 1 is a conceptual diagram showing an NMR system according to an embodiment of the present disclosure.

FIG. 1 shows an NMR system comprising an NMR measurement apparatus 10 and an NMR spectrum analysis apparatus 12. The NMR measurement apparatus 10 can be broadly divided into a measurement unit and a spectrometer. The measurement unit includes a static magnetic field generator and a probe. The static magnetic field generator has a bore serving as a vertical through hole, and an insertion unit in a probe is inserted into the bore. At a head of the insertion unit, magnetic resonance generated in a sample is detected. The spectrometer comprises a transmission unit, a reception unit, a controller, a computation unit, or the like. In the transmission unit, a transmission signal according to a transmission pulse sequence is generated, and is sent to the probe. A reception signal from the probe is sent to the reception unit. An NMR spectrum (hereinafter, also referred to as an "observed spectrum") 14 is generated in the reception unit based on the reception signal.

The observed spectrum 14 exists in a frequency space (frequency domain); that is, the observed spectrum 14 is expressed as a waveform on a frequency axis. An expression of the observed spectrum 14 as a vector is a vector y. The vector y includes a plurality of intensity values arranged in the frequency axis direction. The observed spectrum 14 generally includes a waveform-of-interest component 16 and a baseline component 18.

The waveform-of-interest 16 in general is a portion including one or a plurality of peaks. In a typical spectrum analysis, parameters such as an amplitude, a frequency, a half width, or the like are estimated in units of peaks. On the other hand, the baseline component 18 is a portion to be not fitted, and generally is a wide-band component. More specifically, the baseline component 18 corresponds to a change, a curvature, a slope, or the like having a relatively large period and forming a base of the observed spectrum 14. Alternatively, the base itself having such a component may be understood as the baseline component. In the spectrum analysis, an accurate fitting for the waveform-of-interest component 16 is desired without being affected by such a baseline component 18.

The spectrum analysis apparatus 12 is an apparatus which analyzes the observed spectrum 14 generated by the NMR measurement apparatus 10, and is formed from an information processor device such as a personal computer. The spectrum analysis apparatus 12 searches an optimum set of coefficients as an optimum solution, by stepwise improving a content of a set of coefficient a (coefficient vector a) to minimize an evaluation value J. In the embodiment of the present disclosure, the optimum set of coefficient forms a spectrum analysis result.

Specifically, a computed spectrum 20 is generated by assigning the set of coefficients a to a spectrum generation function (model function). An initial value of the set of coefficients a is $a_0$. A vector expressing the computed spectrum 20 as a vector is a vector $y_m(a)$. The vector $y_m(a)$ includes a plurality of intensity values arranged on the frequency axis. In FIG. 1, a portion forming the computed spectrum 20 is assigned reference numeral 22. A difference between the observed spectrum 14 and the computed spectrum 20 is a residual spectrum 24. In FIG. 1, a portion in which the residual spectrum 24 is to be computed is assigned reference numeral 26.

The residual spectrum 24 exists in the frequency space, and an expression of the residual spectrum 24 in the time space is a residual vector (residual signal) 30. In this process, an inverse Fourier transform (IFFT) or the like is applied to the residual spectrum 24. The residual vector 30 includes a plurality of amplitude values arranged in the time axis direction. In the example shown in the drawing, the residual vector 30 includes a peak portion 30a having a short time width and generated locally, and a flat portion 30b extending in a wide band. The peak portion 30a forms the substance of the baseline component 18 in the frequency space. In other words, the baseline component 18 is expressed as a sparse signal in the time space. The flat portion 30b includes random noise. In FIG. 1, a portion in which the residual vector 30 is computed is assigned reference numeral 28.

In the embodiment of the present disclosure, as the evaluation value J, an Lp norm (wherein p≤1) of the residual vector 30 on the time axis is utilized. The content of the coefficient vector a (coefficient set a) is sequentially updated (refer to reference numeral 34) to minimize the Lp norm of the residual vector 30, and finally, an optimum set of coefficients is identified as the optimum solution. The optimum set of coefficients is output to the outside (refer to reference numeral 36) or displayed. Alternatively, the optimum set of coefficients may be used for other computations. In FIG. 1, a portion in which the evaluation value J is computed and the coefficient vector a is updated is assigned reference numeral 32.

In FIG. 1, the search process of the optimum set of coefficients is schematically shown. In reality, a sequence of computation formulas are repeatedly executed to identify the optimum set of coefficients. For example, computation of the residual spectrum (refer to reference numeral 26), computation of the residual vector (refer to reference numeral 28), and computation of the evaluation value J (Lp norm) (refer to reference numeral 32) may be expressed by a single computation formula.

The Lp norm (wherein p≤1) serving as the evaluation value acts to increase the sparsity of the residual vector 30 which is the norm computation target, during the minimization of the Lp norm. In the example configuration shown in the drawings, the suppression and increasing of the flat portion 30b is prioritized over the suppression of the peak portion 30a. It is noted that the residual vector 30 shown in the drawings is that at the time when the minimization condition is satisfied. The flat portion 30a includes random noise, and thus, the flat portion 30a normally does not completely become zero.

As described, in the embodiment of the present disclosure, the residual spectrum 24 itself is not set as the evaluation target, but the residual vector 30 in the time space is set as the evaluation target. In addition, Lp norm (wherein p≤1) is utilized as the evaluation value. With this configuration, during the search of the optimum solution, the fitting to the waveform-of-interest component 16 is prioritized over the fitting to the baseline component 18. In other words, in the spectrum fitting, the baseline component 18 tends to be more easily ignored. As a result, the computed spectrum 20 can be accurately fitted with respect to the waveform-of-interest component 16. According to the embodiment of the present disclosure, it is not necessary to use a function simulating the baseline component 18, and thus, a workload of a user for designating parameters can be significantly reduced.

Figure 2:
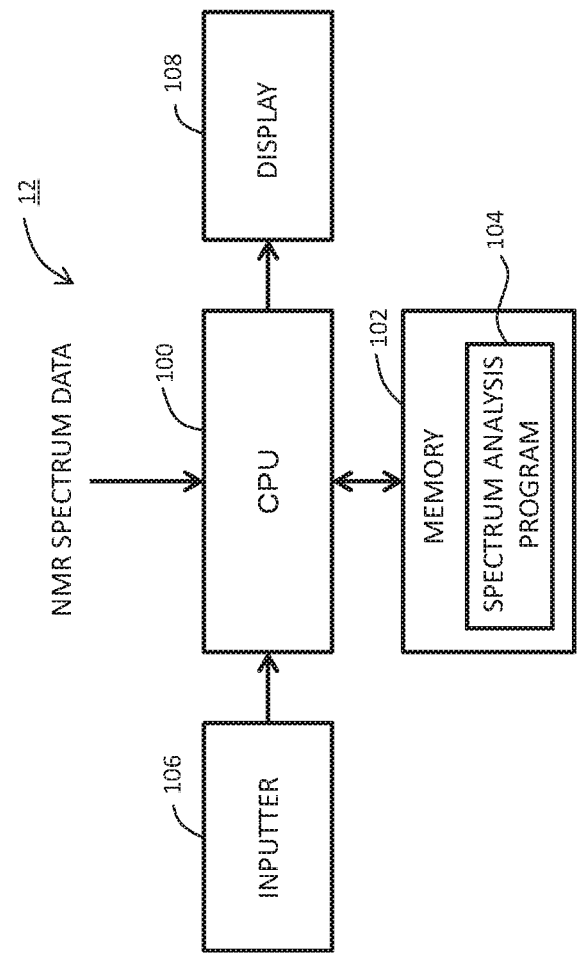
FIG. 2 is a block diagram showing a spectrum analysis apparatus according to an embodiment of the present disclosure.

FIG. 2 shows an example structure of the spectrum analysis apparatus 12. The spectrum analysis apparatus 12 includes a CPU 100, a memory 102, an inputter 106, a display 108, or the like. The memory 102 stores a spectrum analysis program 104. The spectrum analysis program 104 is executed by the CPU 100. In the execution of the spectrum analysis program 104, the CPU 100 functions as a means that receives the NMR spectrum, a searching means that searches an optimum set of coefficients as an optimum solution, or the like. More specifically, the CPU 100 functions as a computed spectrum generation means, a residual spectrum computation means, a residual vector computation means, an evaluation value computation means, a coefficient set updating means, a p changing means, or the like. Alternatively, in place of the CPU 100, another processor may be provided which executes the spectrum analysis program. Alternatively, a plurality of processors may be provided which execute the spectrum analysis program. The concept or "processor" includes various computation devices which execute data computations.

An initial value, a parameter, a setting value, and the like are input by a user, using the inputter 106. An analysis result is displayed on the display 108. For example, NMR spectrum data is transferred from the NMR measurement apparatus to the NMR spectrum analysis apparatus 12 via a network. Alternatively, the NMR spectrum data may be sent from the NMR measurement apparatus to the NMR spectrum analysis apparatus 12 via a transportable recording medium. Alternatively, the NMR spectrum analysis apparatus 12 may be incorporated in the NMR measurement apparatus.

Figure 3:
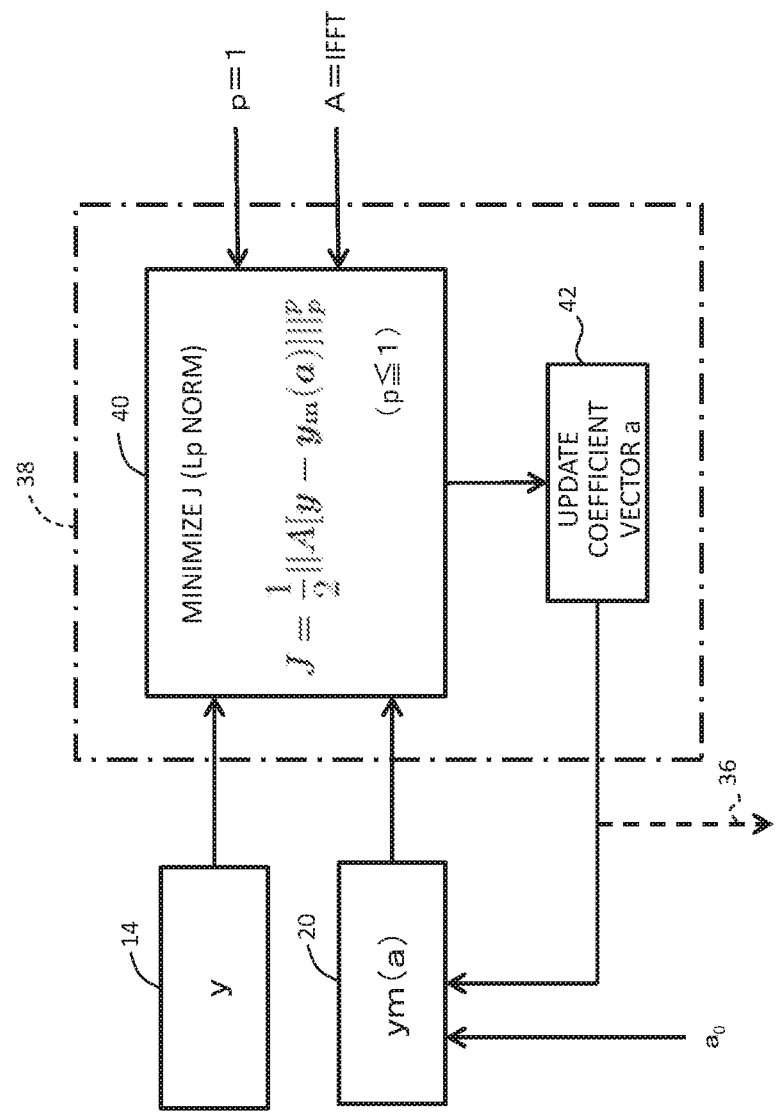
FIG. 3 is a conceptual diagram showing a method of analyzing spectrum according to a first configuration.

FIG. 3 shows a first configuration. In the first configuration, based on the observed spectrum (vector y) 14 and the computed spectrum (vector $y_m(a)$) 20, and according to an IRLS (Iterative Reweighted Least Squares) algorithm 38, computation of the evaluation value J (refer to reference numeral 40) and updating of the coefficient vector a (refer to reference numeral 42) are repeatedly executed. With this process, an optimum coefficient vector is computed as an optimum solution satisfying a minimization condition of the evaluation value J. Details of the IRLS algorithm 38 will be explained later with reference to FIG. 4. In the second through fourth configurations to be described later also, the IRLS algorithm 38 is used. Alternatively, in these configurations, another algorithm which can solve the minimization problem of Lp norm under the condition of p of 1 or smaller may be utilized.

The computed spectrum 20 is generated, for example, by assigning a coefficient vector a (coefficient set a) to a Lorentz function shown as Equation (4).

$$y_m(a) = \sum_{\ell=1}^{q} \frac{c_\ell d_\ell}{d_\ell^2 + (\omega_i - \omega_\ell)^2} \tag{4}$$

The coefficient vector a assigned to Equation (4) described above is, for example, a vector shown in Equation (5).

$$a = [c_1 \ldots c_q d_1 \ldots d_q \omega_1 \ldots \omega_q] \tag{5}$$

In these equations, q represents the number of peaks, and an index of the coefficient represents a peak number. In addition, c represents the amplitude, d represents the half width, and ω represents frequency. The coefficient vector a is actually a column vector. Although q may be included in the coefficient vector a, in general, q is designated by the user or is automatically selected based on the sample or the like.

In the generation of the computed spectrum, in addition to the Lorentz function, a Gauss function, a pseudo-Voigt function, or the like may be used. In the case of the NMR measurement with respect to a solution sample, in general, the Lorentz function, the pseudo-Voigt function, or the like is used. In the case of the NMR measurement with respect to a solid sample, in general, the Gauss function, the pseudo-Voigt function, or the like is used.

The evaluation value J is defined by Equation (6).

$$J = \frac{1}{2} \|A[y - y_m(a)]\|_p^p \tag{6}$$

In the first configuration, p is 1. In other words, the evaluation value J is an L1 norm. A transform matrix A is a matrix for spatial transform, and more specifically is an IFFT matrix. The term of ½ on the right hand side may be ignored in the actual computation. Even when this term is considered, the substance of the evaluation value J is the L1 norm. For the designation of the value for p and the designation of the transform matrix, the inputter is used. For designation of the initial coefficient vector $a_0$ also, the inputter is used. Alternatively, necessary parameters may be preset. Alternatively, prior to the spectrum analysis, a screen may be presented to prompt the user for designation or confirmation of the parameters.

In comparison between Equation (1) already explained above and Equation (6) described above, it can be seen that Equation (1) does not include the transform matrix A. Equation (1) is for evaluating the residual spectrum in the frequency space. On the other hand, Equation (6) includes the transformation matrix A, and is for evaluating the residual vector corresponding to the residual spectrum, in the time space. In addition, in Equation (1), p is 2, and the L2 norm is set as the evaluation value. The L2 norm is a general Euclidean norm, and does not have the function to emphasize the sparsity of the norm computation target in the minimization of the norm. On the contrary, in Equation (6), p is 1, and the L1 norm which has the function to emphasize the sparsity of the norm computation target in the norm minimization is set as the evaluation value J. Such an action is observed when p is smaller than or equal to 1. It is desirable to set the L1 norm as the evaluation value J for simplification of the computation.

Prior to the execution of the IRLS algorithm 38, initial values of the coefficients, upper and lower values of the coefficients, or the like are designated by the user. In addition, a maximum number of trials is also designated by the user.

FIG. 4 exemplifies a specific content of the algorithm related to the first configuration. In S10, initial setting is executed. The term λ represents a marcato number, and the term t represents an update coefficient. The term $k_{max}$ represents a maximum trial number. The term e represents a coefficient for preventing division by zero. The initial coefficient vector is designated by $a_0$, and is substituted into Equation (4) described above, and Equation (6) is executed, to determine an initial evaluation value $J_0$. In S12, it is judged whether or not a first completion condition is satisfied. The computations of S14 and later steps are executed until k exceeds the maximum value. Alternatively, as will be described later, a second completion condition may be incorporated.

In the search of the optimum solution, in general, a first-order derivative and a second-order derivative of the evaluation value computation formula are required. With regard to the L2 norm computation equation, a first-order derivative and a second-order derivative thereof can be computed and the computation can be easily carried out. On the other hand, the computation equation of the L1 norm cannot be differentiated, or, even if differentiation is possible, the differentiation requires massive amount of computations. The IRLS method replaces the L1 norm computation equation with the L2 norm computation equation which is differentiable, by introducing a weight matrix W. Specifically, according to the IRLS method, Equation (5) described above can be transformed into Equation (7).

$$J \simeq \frac{1}{2} \|WA[y - y_m(a)]\|_2^2 \tag{7}$$

The IRLS method differs from the LM method described above in that the weight matrix W is used. In other words, the basic portion of the algorithm is common with the LM method.

In S14, a diagonal element $w_i$ is defined according to the IRLS method. In S16, the weight matrix W is defined based on the diagonal element $w_i$ defined in S14. A matrix diag $([w_1, \ldots, w_N])$ is a matrix in which $[w_1, \ldots, w_N]$ is set as a diagonal element, and all other elements are set to zero. The equation shown in S18 is derived by twice differentiating Equation (7) described above, and H is the Hesse matrix. $\nabla y_m(a_k)$ is determined by partially differentiating Equation (4) by each element of the coefficient vector a. $X^T$ is a transpose matrix of the matrix X, and $X^H$ is a Hermitian transpose of the matrix X. In S20, the Hesse matrix H is corrected by its diagonal element. The equation shown in S22 is derived by once differentiating Equation (7) describe above, and h is a slope vector.

In S24, the coefficient vector a is updated. The update equation is identical to the update equation in the LM method (the update equation is identical to the update equation of Gauss-Newton method forming basis of the LM method, except that the Hesse matrix H is corrected). $H^+$ is a pseudo-inverse matrix of the matrix H.

In S26, the evaluation value J is updated. In S28, a current evaluation value $J_{k+1}$ and a previous evaluation value $J_k$ are compared, and, when the current evaluation value $J_{k+1}$ is smaller than the previous evaluation value $J_k$, $\lambda$ is updated in S30 (normally, $\tau$ is a numerical value greater than or equal to 1 (for example, 10), and $\lambda$ is decreased). When the current evaluation value $J_{k+1}$ is not smaller than the previous evaluation value $J_k$, in S32, $\lambda$ is updated ($\lambda$ is increased). In S34, a previous coefficient vector $a_k$ is substituted into a current coefficient vector $a_{k+1}$ after the update, and in S36, the previous evaluation value $J_k$ is substituted into the evaluation value $J_{k+1}$ after the update. In S38, k is incremented.

By repeatedly executing the above-described algorithm, the optimum solution; that is, an optimum coefficient vector, is determined as a solution to a problem of minimizing the evaluation value J. Specifically, the execution of the algorithm is completed when k reaches the maximum value, and the coefficient vector a at that point is judged as the optimum coefficient vector.

When the second completion condition is to be added, for example, immediately before S38, an index e may be determined as an amount of change of the solution by the following Equation (8), and the algorithm may be completed when the index e is smaller than or equal to a certain value.

$$e = \frac{\|a_{k+1} - a_k\|_2^2}{\|a_{k+1}\|_2^2} \tag{8}$$

Alternatively, an index e may be computed as an amount of change of the evaluation value J by following Equation (9), and the algorithm may be completed when the index e is smaller than or equal to a certain value. Further, other conditions may be employed as the second completion condition.

$$e = \frac{|J(a_{k+1}) - J(a_k)|}{J(a_{k+1})} \tag{9}$$

Next, with reference to FIGS. 5 and 6, an advantage of the first configuration will be described. An energy ratio SBR between the original spectrum (corresponding to the waveform-of-interest component) and the baseline component is defined by Equation (10).

$$SBR[\text{dB}] = 10 \log_{10} \frac{\|x\|_2^2}{\|b\|_2^2} \tag{10}$$

In Equation (10), x represents the original spectrum (vector), and b represents the baseline component (vector) to be artificially added to the original spectrum.

Figure 5:
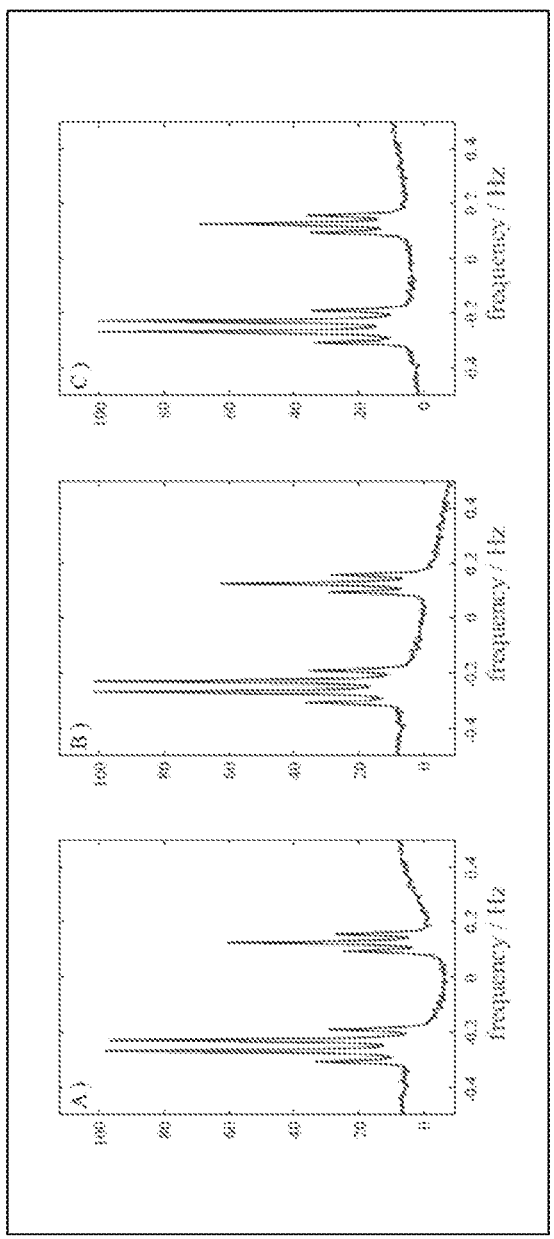
FIG. 5 is a diagram showing three spectra to which three baseline components are added.

FIG. 5 shows three vectors in the case when SBR is 10. A spectrum labeled (A) is a spectrum including a baseline component generated by a cosine function. A spectrum labeled (B) is a spectrum including a baseline component generated by a straight line function. A spectrum labeled (C) is a spectrum including a baseline component configured as a broad Lorentz signal.

Figure 6:
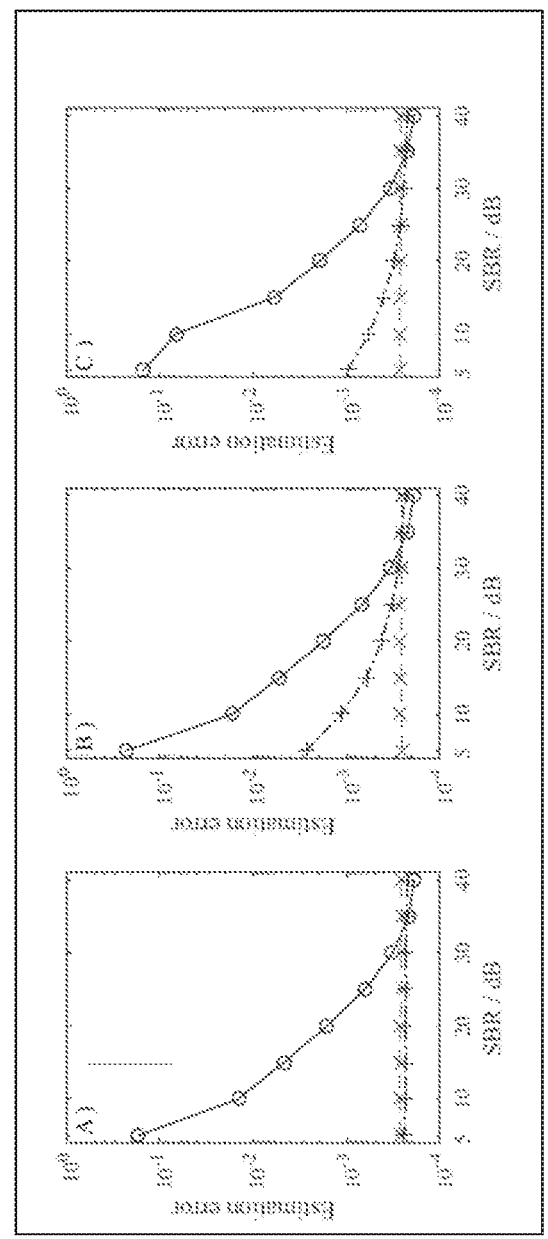
FIG. 6 is a diagram showing a fitting result for three spectra.

FIG. 6 shows an estimated error when the following three fitting methods are applied to the three spectra described above, while changing the SBR. Here, a curve showing the estimated error when the fitting based on the LM method is applied is assigned a plurality of circle (○) signs (Comparative Configuration 1). A curve showing the estimated error when the fitting based on the TLS method is applied is assigned a plurality of X signs (Comparative Configuration 2). A curve showing the estimated error when the fitting based on the first configuration is applied is assigned a plurality of + signs. The estimated error is computed by Equation (11) described below.

$$\text{Esimation error} = \frac{\|x - \hat{x}\|_2^2}{\|x\|_2^2} \tag{11}$$

A denominator of Equation (11) is the L2 norm of the original spectrum. The numerator of Equation (11) is the L2 norm of the difference between the original spectrum and the computed spectrum. The estimated error shown in FIG. 6 is an average value of 1000 estimated errors obtained by applying fitting 1000 times. In each method, the same initial parameters are used. In the TLS method, the baseline function is fitted by cosine functions and N-th order polynomial functions, 10 parameters are included in each function, and these parameters are set to initial values of zero.

In comparison of the first configuration and the LM method, in any of the three spectra, the first configuration is superior except for a part of the spectrum. In comparison of the first configuration and the TLS method, there is no significant difference in the estimation precision between the first configuration and the TLS method, with regard to spectrum (A). When the degree of sparsity of the baseline component is high in the time space, a significantly superior result can be obtained according to the first configuration. In addition, according to the first configuration, the same estimation precision (or a greater estimation precision) as that of the TLS method can be realized with a fewer number of parameters than the TLS method. With regard to spectra (B) and (C), although the TLS method is superior in a range of small SBR, a superior estimation precision is generally obtained also for the first configuration. In a part of the spectrum, the first configuration is superior in estimation precision to the TLS method.

Figure 7:
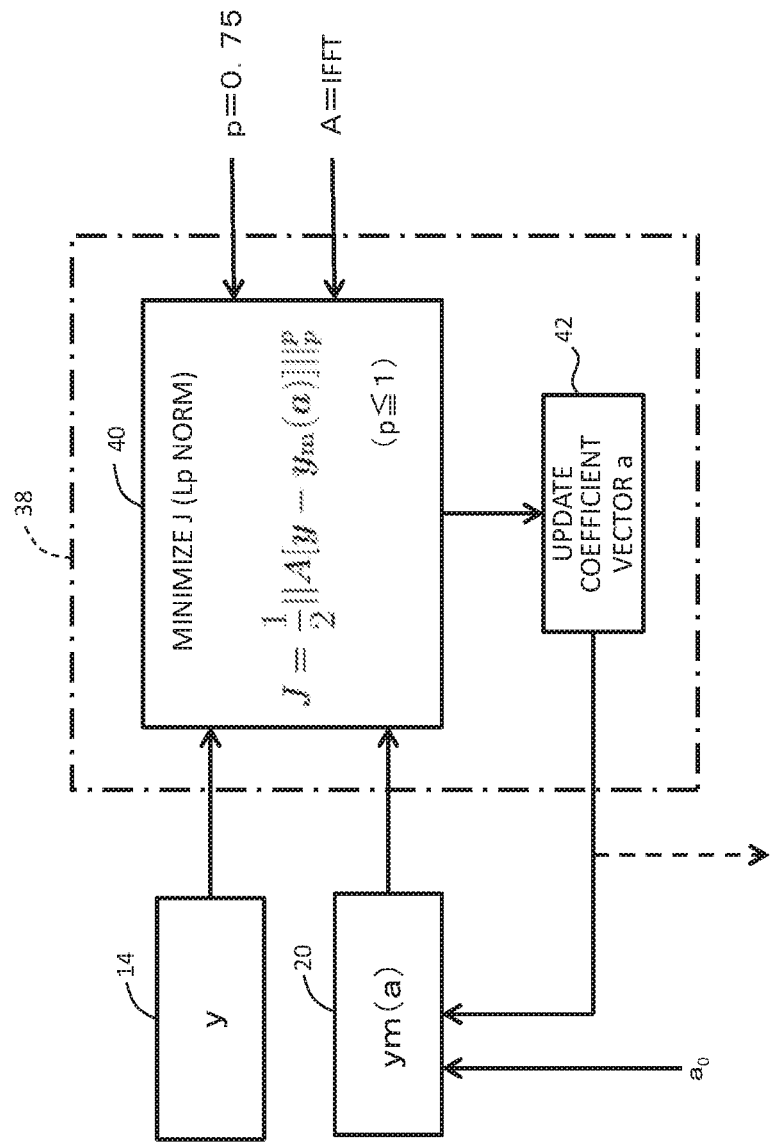
FIG. 7 is a conceptual diagram showing a method of analyzing spectrum according to a second configuration.
Figure 8:
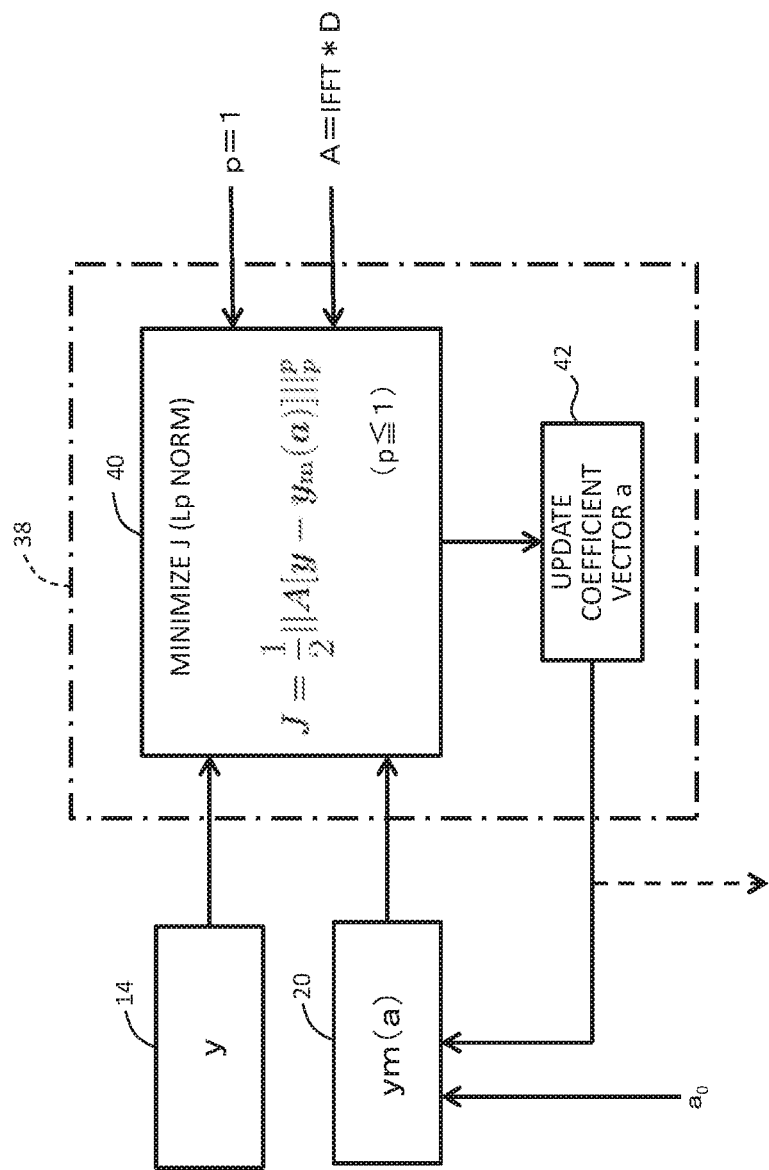
FIG. 8 is a conceptual diagram showing a method of analyzing spectrum according to a third configuration.
Figure 9:
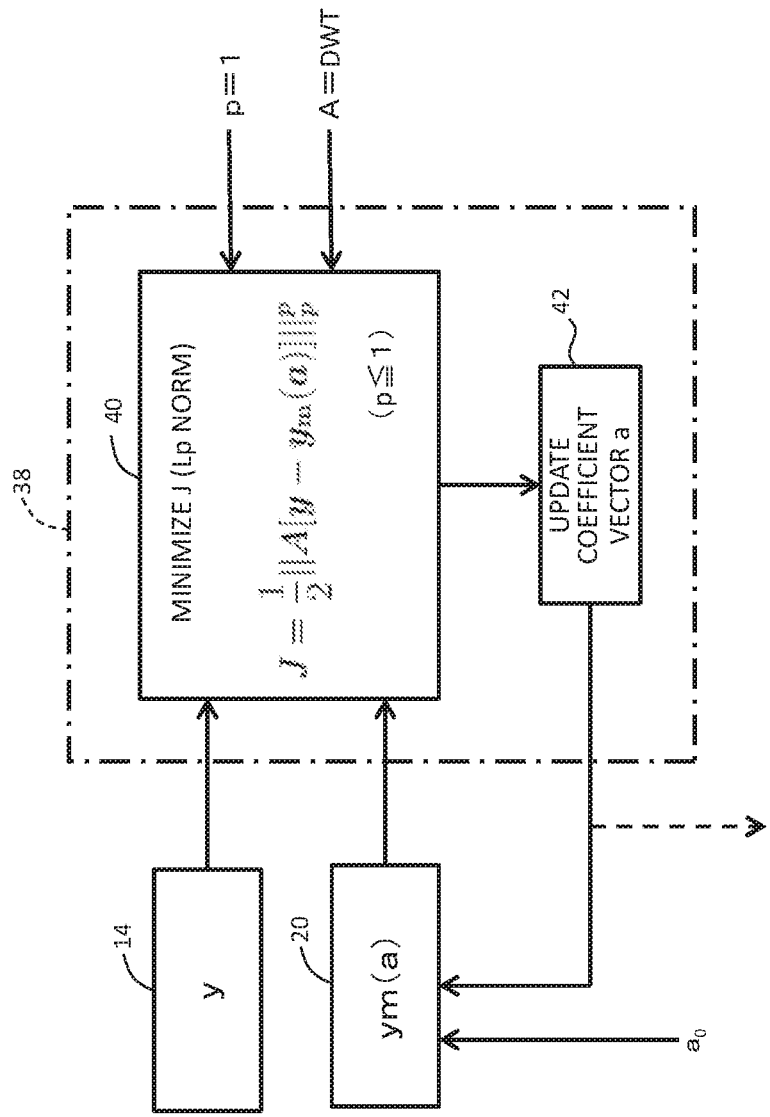
FIG. 9 is a conceptual diagram showing a method of analyzing spectrum according to a fourth configuration.

FIG. 7 shows a second configuration, FIG. 8 shows a third configuration, and FIG. 9 shows a fourth configuration. In these diagrams, elements similar to those shown in FIG. 3 are assigned the same reference numerals, and will not be repeatedly described.

In the second configuration shown in FIG. 7, 0.75 is given as p. In this case, the LM norm functions to emphasize the sparsity of the norm computation target. For example, when a clear sparsity can be recognized in the baseline component on the time axis, the second configuration may be employed. Alternatively, 0.5 may be given as p. Alternatively, the value of p may be set continuously or stepwise changeable.

In the third configuration shown in FIG. 8, 1 is given as p, and an IFFT matrix (first transform matrix) and a slope correction matrix D (second transform matrix) are given as the transform matrix A. For the residual vector, first, the slope correction matrix D is applied, and then, the IFFT matrix is applied. The slope correction matrix has a function to remove a slope component when the baseline component has the slope component in the frequency space. As the slope correction matrix, a known difference matrix may be used. The residual spectrum after the slope corrosion is applied is transformed into the frequency space. In the equation, on the residual spectrum, the slope correction matrix is applied first from the left side, and then, the IFFT matrix is applied from a further left side.

In the fourth configuration shown in FIG. 9, 1 is given as p, and a discrete wavelet transform matrix DWT is given as the transform matrix A. In this manner, the residual spectrum may be transformed into a space other than the time space, to obtain the residual vector. It should be noted that the baseline component must be expressed as a sparse signal in the space to which the spectrum is transformed.

As described, according to the embodiment of the present disclosure, it becomes possible to highly precisely fit a computed spectrum with respect to a waveform-of-interest component. That is, spectrum fitting can be realized which is not strongly affected by the baseline component. The method according to the embodiment of the present disclosure may be applied to spectra other than the NMR spectrum.

The invention claimed is:

1. An apparatus for analyzing a spectrum, comprising:
a measurement apparatus configured to generate an observed spectrum associated with a sample based on a signal associated with the sample; and
a spectrum analysis apparatus comprising at least one processor programmed or configured to:
receive the observed spectrum;
analyze the observed spectrum by determining
an optimum set of coefficients by changing a set of coefficients to be assigned to a function which defines a computed spectrum such that an evaluation value for a residual vector in a predetermined space corresponding to a residual spectrum between the observed spectrum and the computed spectrum is minimized; and
output the optimum set of coefficients or cause the optimum set of coefficients to be displayed, wherein:
the computed spectrum is fitted to a waveform-of-interest component in the observed spectrum,
the predetermined space is a space in which a baseline component in the observed spectrum is expressed as a sparse signal, and
the evaluation value is an Lp norm of the residual vector in the predetermined space (wherein $p \leq 1$).

2. The apparatus for analyzing the spectrum according to claim 1, wherein
the predetermined space is a time space.

3. The apparatus for analyzing the spectrum according to claim 1, wherein
the residual vector in the predetermined space is determined by applying a transform matrix on the residual spectrum.

4. The apparatus for analyzing the spectrum according to claim 3, wherein
the transform matrix includes a first transform matrix which transforms from a frequency space to the predetermined space.

5. The apparatus for analyzing the spectrum according to claim 4, wherein
the transform matrix further includes a second transform matrix which applies a slope correction to the residual spectrum in the frequency space, and
the second transform matrix and the first transform matrix are applied in this order to the residual spectrum before the slope correction.

6. The apparatus for analyzing the spectrum according to claim 1, further comprising:
an inputter for changing the value of p.

7. The apparatus for analyzing the spectrum according to claim 1, wherein
the observed spectrum is an NMR spectrum.

8. An apparatus for analyzing a spectrum, comprising:
a measuring means that generates an observed spectrum associated with a sample based on a signal associated with the sample;
a receiving means that receives the observed spectrum;
a search means that determines an optimum set of coefficients by changing a set of coefficients to be assigned to a function which defines a computed spectrum such that an evaluation value for a residual vector in a predetermined space corresponding to a residual spectrum between the observed spectrum and the computed spectrum is minimized; and
an output means that outputs the optimum set of coefficients or a means for causing the optimum set of coefficients to be displayed, wherein:

the computed spectrum is fitted to a waveform-of-interest component in the observed spectrum, the predetermined space is a space in which a baseline component in the observed spectrum is expressed as a sparse signal, and the evaluation value is an Lp norm of the residual vector in the predetermined space (wherein $p \leq 1$).

9. A method for analyzing a spectrum, comprising:

generating, with a measurement apparatus, an observed NMR spectrum associated with a sample based on a signal associated with the sample;

receiving, with a spectrum analysis apparatus, the observed NMR spectrum;

determining, with the spectrum analysis apparatus, an optimum set of coefficients by changing a set of coefficients to be assigned to a function which defines a computed spectrum such that an evaluation value for a residual vector in a predetermined space corresponding to a residual spectrum between the NMR spectrum and the computed spectrum is minimized; and outputting, with the spectrum analysis apparatus, the optimum set of coefficients or causing, with the spectrum analysis apparatus, the optimum set of coefficients to be displayed, wherein:

the computed spectrum is fitted to a waveform-of-interest component in the NMR spectrum, the predetermined space is a space in which a baseline component in the NMR spectrum is expressed as a sparse signal, and the evaluation value is an Lp norm of the residual vector in the predetermined space (wherein $p \leq 1$).

* * * * *